United States Patent [19]

Carlson et al.

[11] Patent Number: 5,629,624
[45] Date of Patent: May 13, 1997

[54] SWITCHED FIELD MAGNETIC RESONANCE IMAGING

[75] Inventors: Joseph W. Carlson, Kensington; Lawrence E. Crooks, Richmond; Leon Kaufman, San Francisco, all of Calif.

[73] Assignee: The Regents of the University of California, Oakland, Calif.

[21] Appl. No.: 545,068

[22] Filed: Jun. 29, 1990

[51] Int. Cl.$^6$ .................................................. G01V 3/00
[52] U.S. Cl. ............................................ 324/309; 324/307
[58] Field of Search ............................ 324/300, 301, 324/307, 309, 314

[56] References Cited

U.S. PATENT DOCUMENTS

| | | | |
|---|---|---|---|
| 4,573,015 | 2/1986 | Abe et al. | 324/309 |
| 4,602,641 | 7/1986 | Feinberg | 128/653 |
| 4,713,616 | 12/1987 | Shimazaki et al. | 324/309 |
| 4,716,369 | 12/1987 | Sekihara et al. | 324/309 |
| 4,887,034 | 12/1989 | Smith | 324/307 |
| 4,962,357 | 10/1990 | Sotak | 324/309 |
| 5,034,692 | 7/1991 | Laub et al. | 324/309 |
| 5,057,776 | 10/1991 | Macovski | 324/309 |

FOREIGN PATENT DOCUMENTS

| | | |
|---|---|---|
| 57-211539 | 12/1982 | Japan. |
| 2128745 | 5/1984 | United Kingdom. |
| 2210982 | 6/1989 | United Kingdom. |
| WO90/03583 | 4/1990 | WIPO. |

OTHER PUBLICATIONS

Lundbom et al, "Magnetic Field Dependence of $1/T_1$ of Human Brain Tumors," Investigative Radiology, No. 1990, vol. 25, pp. 1197–1205.

Koenig et al, "A Field–Cycling Relaxometer," NMR Spectroscopy of Cells & Organisms, vol. II, Raj K. Gupta, Editor, CRC Press, Boca Raton, FL (1987), pp. 108–114.

Crooks et al, "Magnetic Resonance Imaging: Effects of Magnetic Field Strength," Radiology, vol. 151, No. 1, Apr. 1984, pp. 127–133.

Ortendahl et al, "Analytical Tools for Magnetic Resonance Imaging," Radiology, vol. 153, No. 2, Nov. 1984, pp. 479–488.

"Localized Volume Selection Technique Using an Additional Radial Gradient Coil", S.Y. Lee & Z.H. Cho, Magnetic Resonance in Medicine, vol. 12, No. 1, pp. 56–63, Academic Press, Inc. (1989).

"NMR Fresnel Transform Imaging Using a Scannable Nonlinear Field Gradient", Yamada et al., Electronics and Communications in Japan, Part 2, vol. 72, No. 3, pp. 64–71, Scripta Technica, Inc. (1988).

"Time of Flight MR Angiography Using Selective Saturation Method", Cho et al., Book of Abstracts, vol. 2, p. 919, Society of Magnetic Resonance in Medicine (1988).

Primary Examiner—Louis M. Arana
Attorney, Agent, or Firm—Nixon & Vanderhye P.C.

[57] ABSTRACT

Switched magnetic fields (in addition to the usual pulsed magnetic gradient fields) aiding and/or opposing the usual constant static magnetic field $B_o$ are utilized so as to increase the signal-to-noise ratio for given available imaging sequence times and/or to provide special imaging effects.

13 Claims, 7 Drawing Sheets

SWITCHED FIELD MAGNETIC
RESONANCE IMAGING

This invention generally relates to magnetic resonance imaging (MRI) and/or magnetic resonance spectroscopic imaging (MRSI) using magnetic resonance phenomena. It is more particularly directed to the judicious use of switched additional magnetic fields to aid and/or oppose a constant static magnetic field $B_o$ during certain preselected portions of an MRI or MRSI imaging sequence.

MRI and MRSI are now well-known imaging techniques. At least MRI systems are widely available from commercial sources. Typically, such systems use a constant, substantially homogeneous, static magnetic field $B_o$ (sometimes called a "polarizing field) applied to nuclei to be imaged within an image volume. Those nuclei having net magnetic moments tend to align such moment with the superimposed static magnetic field $B_o$ (typically a rather strong field somewhere in the range of about 0.1 to 2.0 Tesla).

By judicious application of RF NMR nutation pulses in conjunction with pulsed magnetic gradient fields (typically oriented in the same direction as $B_o$ but having linear gradients along mutually orthogonal x,y,z axes), responsive RF NMR signals may be elicited (e.g., spin echoes) so as to provide NMR data indicative of the relative location and concentration of NMR nuclei. To obtain a complete set of related MRI data sufficient for imaging purposes, it is typically necessary to repeat similar (but typically slightly different—e.g., using slightly different pulsed magnetic gradient fields) NMR pulse sequences to complete an entire MRI sequence (typically extending over several minutes). The time between repetitions of such NMR pulse sequences is typically referred to as the "TR" interval.

As a part of each TR interval, there is typically included a sample preparation period during which nuclei are permitted to "relax" back towards nominal alignment with the imposed static magnetic field $B_o$ in readiness for the next NMR pulse sequence. The "relaxation" of nuclei populations back toward a quiescent alignment with the $B_o$ static field occurs with a characteristic time constant T1 (typically referred to as the T1 NMR parameter for a given species of NMR nuclei). For some MRI sequences, the sample preparation period may also include one or more RF NMR nutation pulses.

Since the signal strength of elicited NMR RF responses is directly related to the relative proportion of nuclei which have attained such alignment prior to an NMR pulse sequence, one would ideally like to prolong the sample preparation period sufficiently to attain substantial equilibrium (i.e., maximum "magnetization" of the nuclei). In accordance with the usual analysis of such exponential processes, this would typically require on the order of about 3 T1 or more seconds of sample preparation prior to each NMR pulse sequence.

However, since literally hundreds of NMR pulse sequences must be performed in a complete MRI sequence and since the overall time available for a complete imaging sequence is limited (e.g., by the economics of equipment and skilled attendant usage and by patient discomfort, patient distress over prolonged imaging periods, etc.), attainment of substantial nuclei equilibrium during the sample preparation portion of a TR interval can lead to an excessively long MRI imaging sequence. Thus, there are typically competing interests in maximizing the effective signal-to-noise ratio of elicited NMR data—while at the same time minimizing the overall elapsed time required for a complete MRI sequence.

One important factor in MRI image quality is the static magnetic field strength. Indeed, the field strength is perhaps one of the first properties specified in the design of an MRI system. At the present time, medical MRI researchers are divided into various camps supporting various static field strengths of MRI systems. Some prefer relatively low magnetic field strengths (e.g., as associated with permanent magnet designs that have lower initial costs, lower maintenance, etc.,) while others prefer higher field strengths (providing larger nuclei magnetization for static nuclear spins in equilibrium with the static field—therefore providing relatively more useful signal from an NMR pulse sequence that begins with a fully relaxed system).

It is known that at lower field strengths, relatively short TR intervals for NMR sequences actually result in higher contrast images than those acquired under the same TR interval conditions using higher field strengths.

One reason for this apparent anomaly is that at low field most tissue T1 parameters are relatively shorter. The T1 parameter for water is constant—and relatively long—as a function of field strength. However, at high field, many tissue T1 parameters approach that of water while at low fields, tissue T1 parameters take on more diverse and shorter values. Such diversity can provide enhanced image contrast between such different types of tissues.

Lower field strength also turns out to provide more signal to noise than one might expect. The signal to noise ratio is directly related to the length of the elicited signal sampling window. It turns out that the length of the sampling window can sometimes be made longer than with a higher strength field.

For example, the maximum sampling window time is at least partly determined by the degree of chemical shift (CS) artifact which is permitted to exist in the final image and to the absolute homogeneity of the static magnetic field $B_o$. To decrease the noise content of the sampled signal, the sampling period may be increased while the magnitude of the superimposed readout magnetic gradient field is reduced. However, a limit to this enhancement process is reached when the inhomogeneties of the static magnetic field $B_o$ contribute larger magnetic field gradients than the applied readout gradient field. The apparent chemical shift (CS) between different hydrogen nuclei occurring in different molecular combinations also is proportional to the product of imposed magnetic field strength and sampling time.

Thus, a lower static field strength permits proportionally longer sampling periods for a given amount of chemical shift. However, as should now be appreciated, there is an upper limit on increased sampling time window length as determined by the absolute homogeneity of the static magnet field.

Another limit on extending the sampling time is T2 decay. If the tissue signal decays away due to T2 during the sampling time, resolution is degraded. A short T2 tissue will have its signal "smeared" over more than the usual voxels—and this reduces signal strength. This resolution loss affects the signal of small objects (about the size of a voxel) more than for larger objects.

Thus, there are attempts to achieve an MRI system which maintains the simplicity (e.g., low initial cost, low operating expense) of a low static field design (e.g., using permanent magnets)—but which nevertheless yields a higher signal-to-noise ratio that is typically more characteristically associated with higher strength static field MRI systems. One way to attempt this optimization is by use of a "static" magnet that can be switched between two different field strengths. Sample magnetization could then be prepared at a relatively higher field strength followed by an NMR pulse sequence at a relatively lower nominal magnetic field strength.

At least one prior proposal (Japanese Patent No. 57-211, 539, published Dec. 25, 1982 naming Yamamoto et al as inventors) asserts that the signal-to-noise ratio improves at a rate of about 1.5 times the static magnetic field intensity. It also asserts that the frequency of RF NMR responses is proportional to the static magnetic field strength—thus, due to skin effects, it is asserted that higher field strength inherently causes weakened RF signal response. They also note problems of maintaining substantial homogeneity with higher and higher field strength structures.

Yamamoto et al propose an improvement designed to avoid higher frequency NMR RF responses by using a higher "static" magnetic field strength only during sample preparation (as compared to the nominal "static" field strength present during an actual subsequent NMR pulse sequence). To achieve these different "static" field strengths at different times in the TR interval, Yamamoto et al superimpose a switched aiding magnetic field during the sample preparation period only. In this manner, initial nuclei magnetization is maximized (apparently by extending the sample preparation period sufficiently to achieve substantial equilibrium—e.g., about 3 T1 or more) while also maintaining relatively lower frequency RF NMR responses (thus avoiding alleged degradation of NMR RF signal responses at higher frequency). The overall result alleged by Yamamoto et al is an improved signal-to-noise ratio.

Yamamoto et al also recognize that such an auxiliary switched magnetic field generator need not be ultrahomogeneous (noting that perhaps one percent inhomogeneity may be permitted in the switched field generator whereas much higher homogeneity is required of the constant static magnetic field generator used during the NMR sequences).

However, Yamamoto et al fail to recognize the interrelationships between maximum permitted overall MRI imaging sequence time, maximum TR intervals, maximum sampling window intervals, etc., and the effectively available sample preparation time in view of these constraints. Nor does Yamamoto et al discuss related RF transmitter power requirements, signal reception bandwidth, permissible chemical shift artifact, etc.

As we will briefly explain below, the effective signal-to-noise ratio in NMR (overall) is proportional to the transverse nuclear magnetization during sampling divided by the square root of the RF reception bandwidth. Thus, contrary to the assertions of Yamamoto et al, factors of RF frequency in the sample resistance and the detector efficiency cancel one another so as to achieve an interesting result.

For example, the noise component of MRI signals is proportional to the quantity:

$$N \propto \sqrt{R \Delta v} \qquad \text{Equation (1)}$$

where R is the resistance of the receiver RF coil and $\Delta v$ is the RF reception bandwidth. For frequencies above a few megahertz, the effective resistance R of a receiver RF coil is generated almost exclusively by the sample tissue itself—and is proportional to the detection frequency squared.

The allowable reception bandwidth is also frequency dependent—but decreases with frequency (typically in a more complex way than a simple scaling with frequency).

At the same time, the useful signal component of elicited NMR RF responses is proportional to the product of transverse nuclear magnetization (m) and the detection frequency (w). The factor of frequency here is due to the inductive nature of the detection process and, again, is determined by the observation frequency. The effective magnetization magnitude depends on quantities such as the effective field strength and the pulse sequences (e.g., the value of TR, the value of applied pulse magnetic fields, their repetition rates, etc).

Thus, the useful signal component is proportional to:

$$S \propto mw \qquad \text{Equation (2)}$$

If one ratios equations 2 and 1 so as to obtain a representation of signal-to-noise ratio variations with frequency, one finds the following:

$$S/N \propto \frac{m\omega}{\sqrt{\omega^2 \Delta v}} \qquad \text{Equation (3)}$$

And as can now be seen, the factors of frequency cancel in equation 3 so as to leave the effective signal-to-noise ratio proportional to:

$$S/N \propto m/\sqrt{\Delta v} \qquad \text{Equation (4)}$$

Contrary to the Yamamoto et al teaching, the theoretical loss of useful signal at higher frequencies (e.g., allegedly due to RF skin-effects) is not really the problem. Furthermore, since it appears that their sample preparation times are extended so as to achieve essentially full equilibrium (e.g., several T1 time constants), their approach would materially increase the overall time required for acquiring high quality MRI image data in many MRI sequences.

In short, although the approach of Yamamoto et al may well produce the largest possible response signal level if unlimited time is available, it turns out not to be the most efficient use of available limited MRI imaging time.

NMR has, of course, been used for decades in chemical analysis. In such NMR applications, special sample preparation techniques have long been known. The static magnetic field has, for example, been greatly reduced (possibly even turned off) during some data acquisition sequences (e.g., so as to reduce line broadening). Control of the "static" magnetic field used in NMR data acquisition sequences has also been employed for precision magnetometers used in aircraft, and the like (e.g., so as to boost the sample polarization).

We have now discovered several novel switched field MRI techniques for more efficiently using available imaging time and/or for achieving special imaging effects.

For example, we have discovered that most of the expected increase in useful signal due to increased magnetization obtained during the sample preparation time is achieved relatively early—that is long before one approaches full equilibrium. In particular, we have discovered that a switched additive sample preparation polarizing field can be applied for considerably less than even one spin-lattice relaxation T1 time constant while still achieving significant improvement in useful signal outputs. In one presently preferred embodiment, a total TR interval is only about 1.25 T1 for nuclei being imaged—and only about one-third of the TR interval is devoted to sample preparation time (e.g., on the order of 0.4 T1).

We have discovered that such relatively shorter switched boosting fields during a relatively short sample preparation time provides for a much more efficient use of time (taking into account the fact that as sample preparation time increases, the available window for sampling the elicited NMR response signal necessarily decreases for a given TR interval). In effect, we have discovered that extending the sample preparation time (e.g., in accordance with the Yamamoto et al teaching) can actually decrease the effective signal-to-noise ratio (in a realistic environment for a fixed TR interval) by a factor roughly proportional to the inverse of the square root of the number of "missed" signal samples.

Accordingly, by taking advantage of the fact that most of the possible improvement in signal-to-noise ratio occurs very quickly during boosted "static" field conditions in a sample preparation period, the overall length of the sample preparation period can be maintained quite short—thus leaving ample time for the extended signal sampling windows.

Since the NMR sequence itself (e.g., typically including at least one RF NMR nutation pulse, a series of magnetic gradient pulses and a responsive RF NMR signal reception time) occurs at a relatively lower field strength, RF transmitter power requirements are reduced and signal acquisition RF reception band width can be made quite narrow without large chemical shift artifact.

We have also discovered that switched fields opposing the static magnetic field $B_o$ can often be used to achieve improved MRI system operations. For example, if the static magnetic field structure is of the "high strength" design, then an opposing switched field may be utilized during an NMR pulse sequence! For reasons briefly noted above, this may actually result in improved image contrast—and it will also reduce necessary RF transmitter power. For those particular MRI sequences most useful in low field system designs, such opposing fields might even be left on continuously throughout a given MRI sequence.

In other applications (e.g., NMR spectroscopy pulse sequences), such opposing fields might be pulsed on only during transmitted RF NMR nutation pulses (thus lowering the required RF transmitter power in the presence of the nominally very high strength static $B_o$ fields used for spectroscopy imaging and simultaneously permitting a lower RF transmitter frequency).

If the switched magnetic field is spatially confined either outside or inside the image volume, then it may also be used to enhance the contrast of nuclei flowing into the image volume (e.g., blood flow into a patient image volume). For example, a switched aiding magnetic field could be utilized outside the image volume so as to increase the magnetization of inflowing blood and/or an opposing switched field could be used inside the image volume to also cause a relative increased magnetization for inflowing blood nuclei during a subsequent NMR pulse sequence.

In yet another application, a switched opposing magnetic field approximately equal in magnitude to the static magnetic field $B_o$ may be pulsed "on" for a specific short interval designed to be at least approximately T1 for nuclei to be suppressed from an MRI image. For example, a pulsed opposing field of this type at about 300 milliseconds would help suppress signal from tissues surrounding cerebral spinal fluid (CSF) in the brain and spinal cord while yet permitting imaging of the CSF itself (which has a T1 NMR parameter substantially in excess of 300 milliseconds).

If the switched fields are properly shaped, they may also be used to enhance magnetization in selected areas of an image volume of more importance than others—while perhaps simultaneously also suppressing image data from other selected sub-portions of the image volume.

By controlling one or more of the parameters associated with the switched field (e.g., the magnitude of the aiding/ opposing switched field, the duration of "on" time for the switched field and its relative timing such as a delay time from cessation of the switched field to the beginning of an NMR pulse sequence), additional control variables become available for controlling contrast enhancement in MRI imaging sequences.

These as well as other objects and advantages of this invention will be more completely understood and appreciated by carefully reading the following more detailed description of presently preferred exemplary embodiments of the invention taken in conjunction with the accompanying drawings, of which:

Figure 2A:
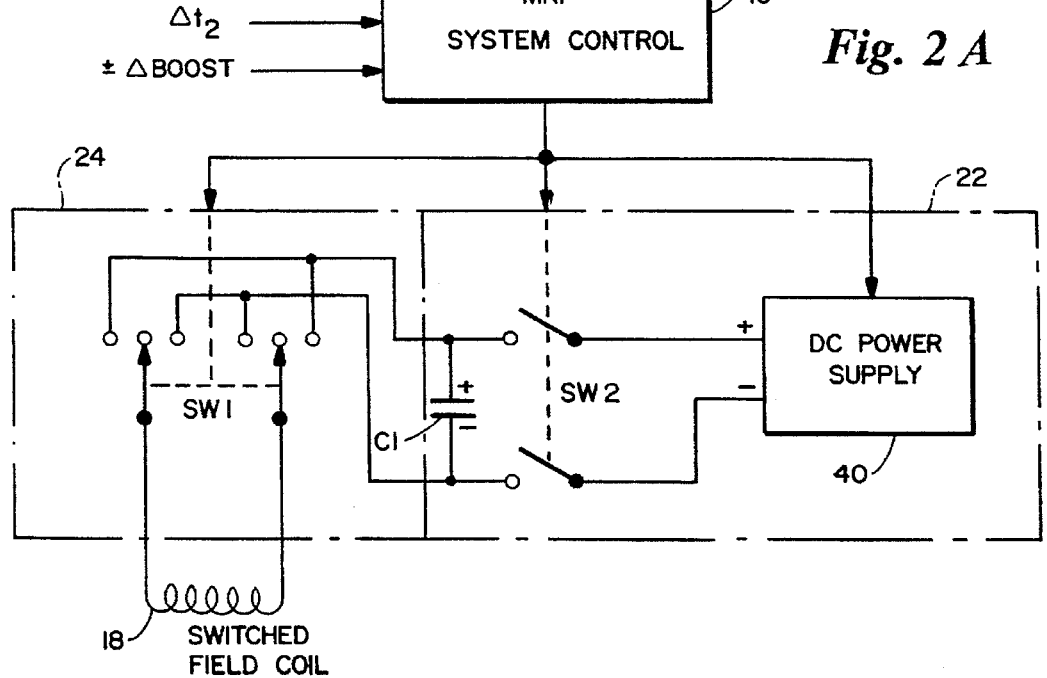
FIG. 2A is a diagram of one possible charged capacitor current supply as well as switch and polarity control aspects of one possible FIG. 1 embodiment.
Figure 2B:
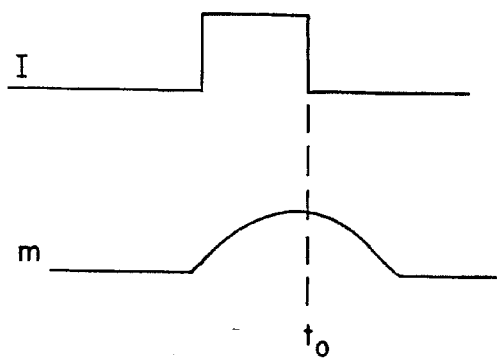
FIG. 2B, 2C and 2D are schematic waveform diagrams illustrating an ideal square wave Δ boost control of magnetization m, the Δboost control achievable using a half sinusoid current I pulse control as in FIG. 2A and a presently preferred "fly-back" triangular current I pulse control, respectively.
Figure 2C:
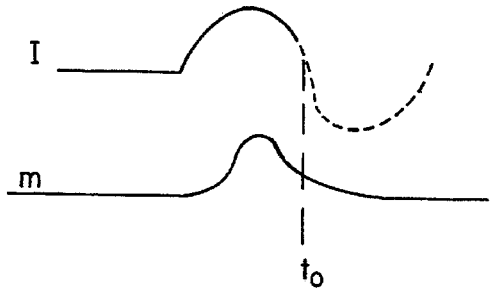
Figure 2D:
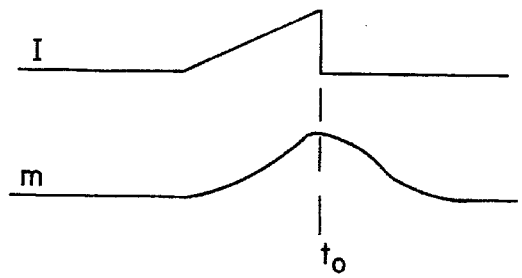
Figure 2E:
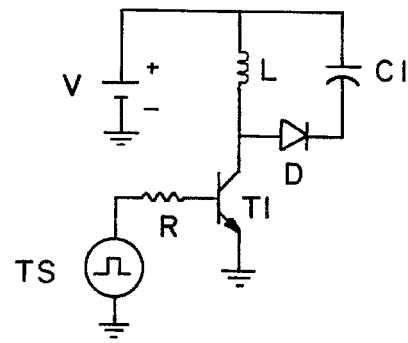
Figure 2F:
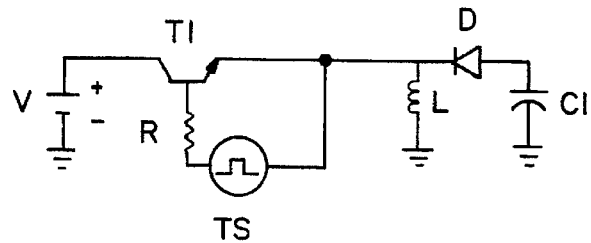
Figure 3:
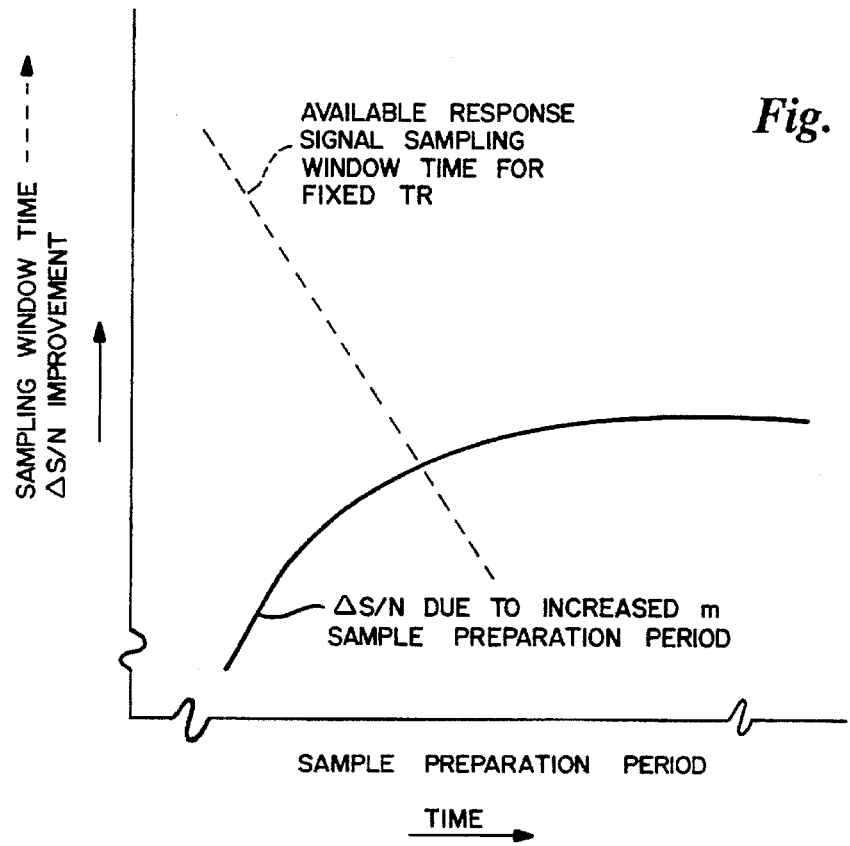
Figure 4:
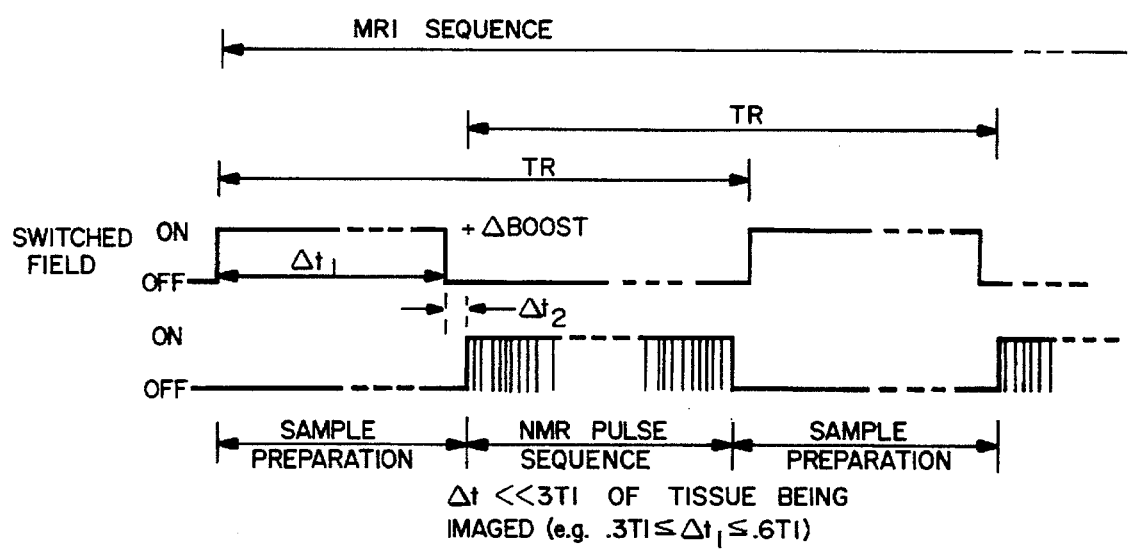
Figure 5:
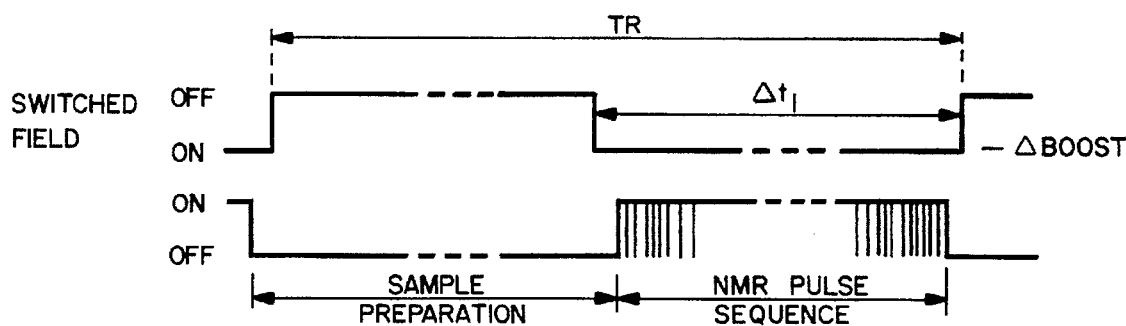
Figure 6:
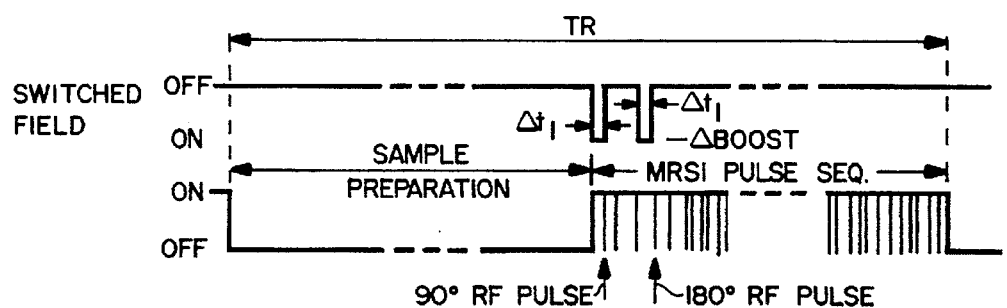
Figure 7:
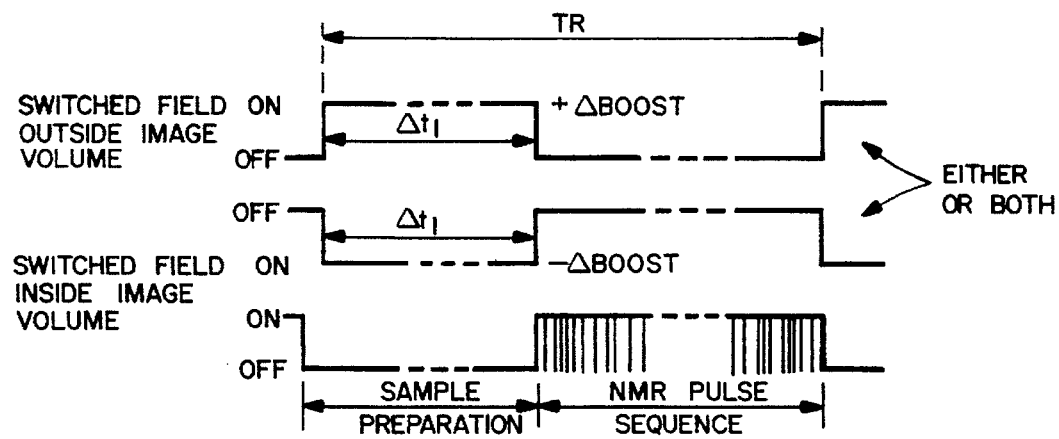
Figure 8:
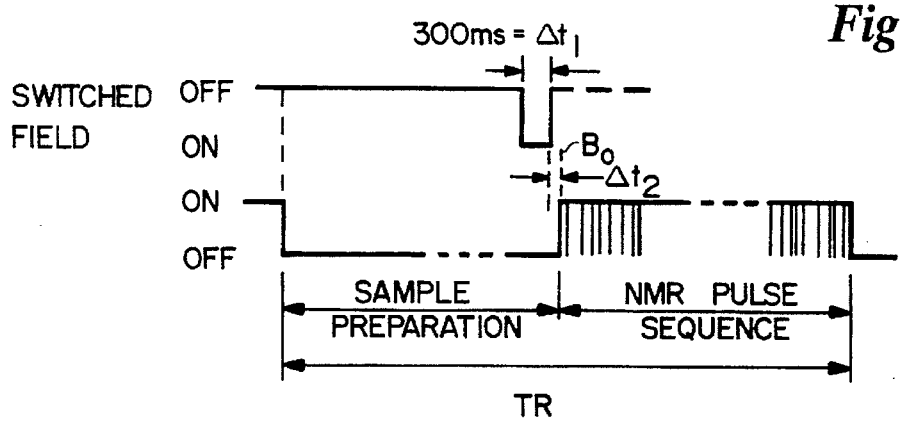
Figure 9:
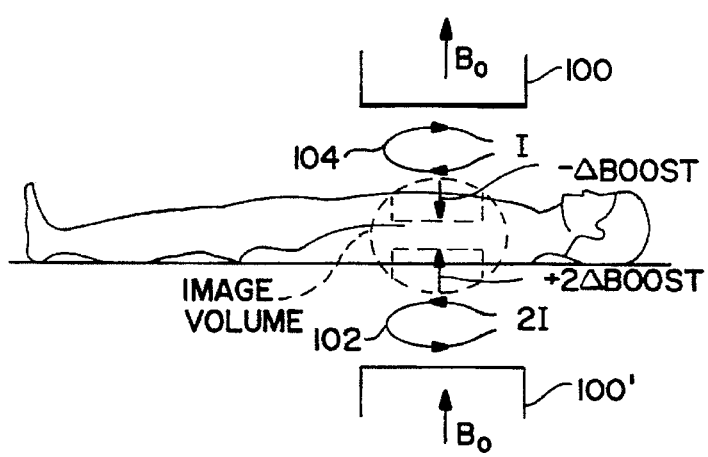
Figure 10:
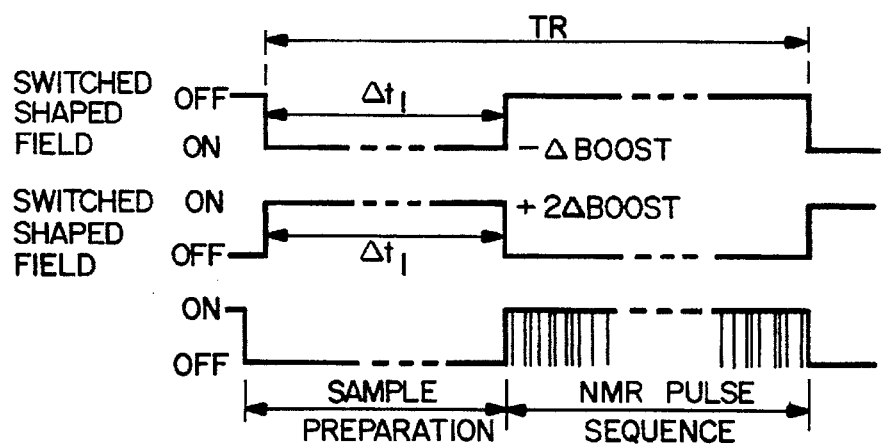
Figure 11:
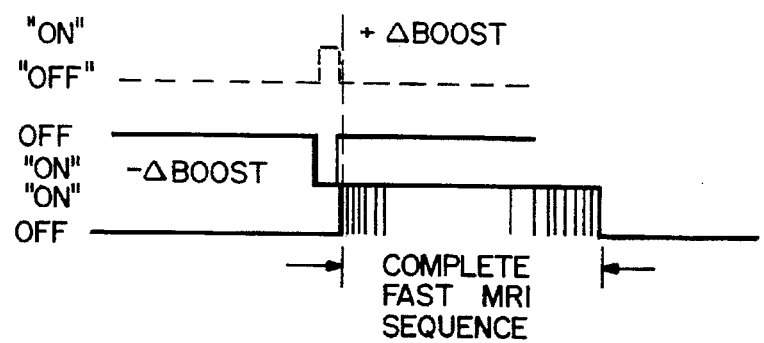
Figure 12:
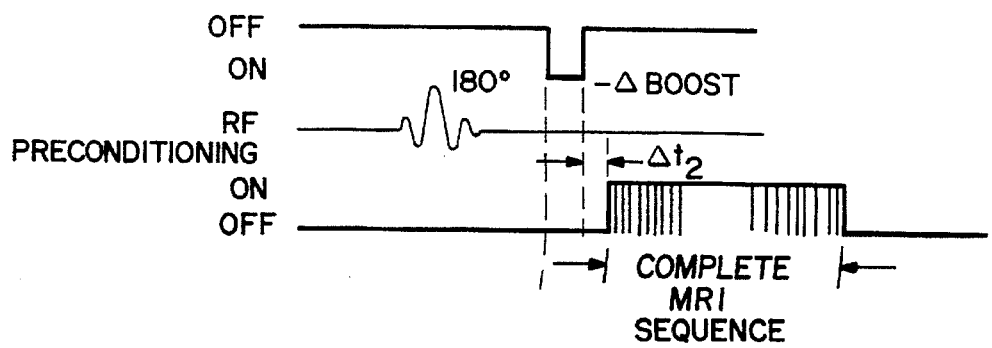
Figure 13:
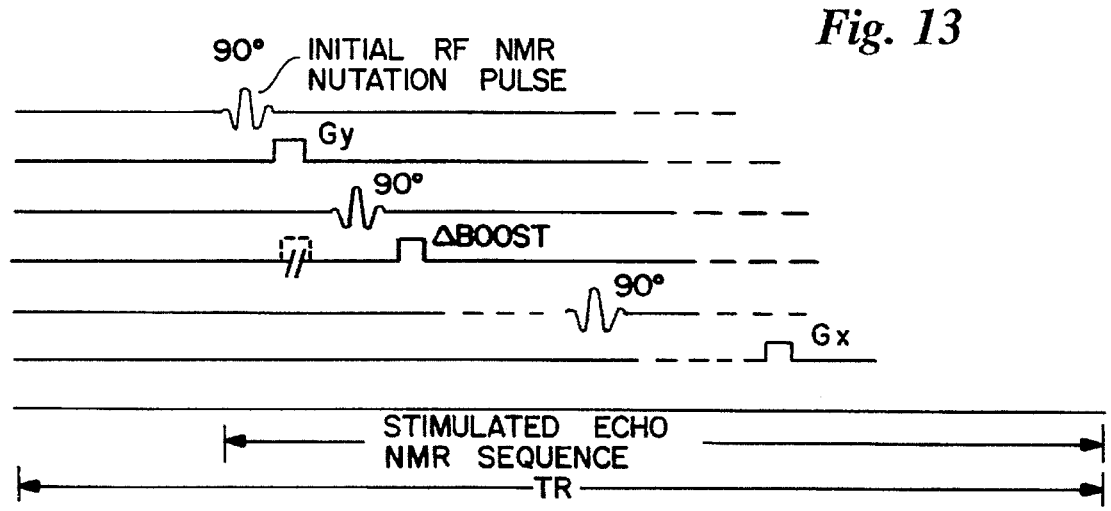

FIGS. 2E and 2F schematically depict suitable flyback circuits for achieving the control depicted in FIG. 2D;

FIG. 3 is a schematic graphical depiction helpful in explaining an optimized relationship between the signal sampling window and the sample preparation period for a fixed TR interval in accordance with one specific exemplary embodiment of this invention;

FIG. 4 is a schematic timing diagram for the exemplary embodiment related to FIG. 3;

FIG. 5 is a schematic timing diagram for another exemplary embodiment of this invention where an opposing boost field is utilized during an NMR pulse sequence;

FIG. 6 is a schematic timing diagram showing the use of opposing switched fields during RF nutation pulses of an NMR spectroscopy pulse sequence in yet another exemplary embodiment of this invention;

FIG. 7 is a schematic timing diagram showing the use of switched aiding and/or opposing fields of respectively disposed outside or inside the image volume during a sample preparation period of yet another exemplary embodiment of this invention;

FIG. 8 is a schematic timing diagram showing a switched field pulse of particular duration designed to substantially cancel magnetization of nuclei for which imaging is to be suppressed in yet another exemplary embodiment of this invention;

FIG. 9 is a schematic depiction of another exemplary embodiment of this invention utilizing shaped switched fields which aid and/or oppose a nominal static magnetic field $B_o$ in selected sub-sections of an image volume;

FIG. 10 is a schematic timing diagram associated with the embodiment of FIG. 9;

FIGS. 11 and 12 are schematic depictions of other exemplary embodiments of this invention utilizing switched fields prior to an entire "fast" MRI sequence (as opposed to during each TR interval within an MRI sequence);

FIG. 13 is a schematic depiction of a stimulated pulse echo NMR sequence using a Δboost pulse after phase encoding pulses have been used.

Figure 14A:
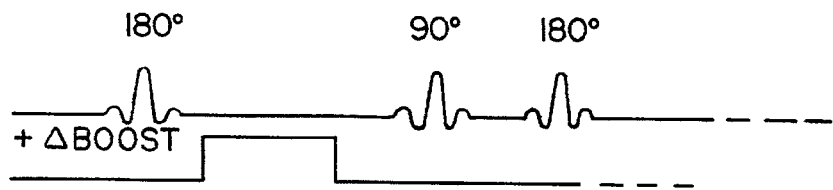
Figure 14B:
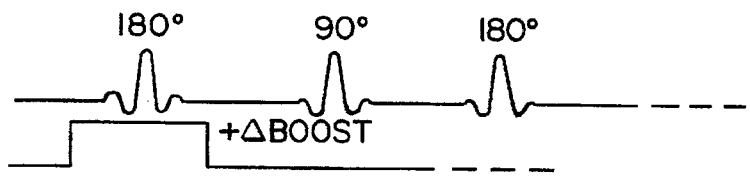
Figure 15:
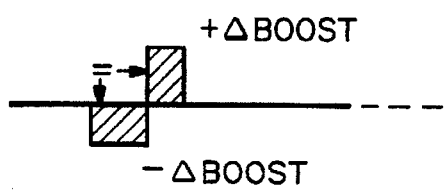

FIGS. 14A and 14B depict sample preparation periods where some of the preparatory RF nutation pulses overlap the Δboost pulse(s); and FIG. 15 depicts bi-polar Δboost pulses used for special preparatory effects.

Figure 1:
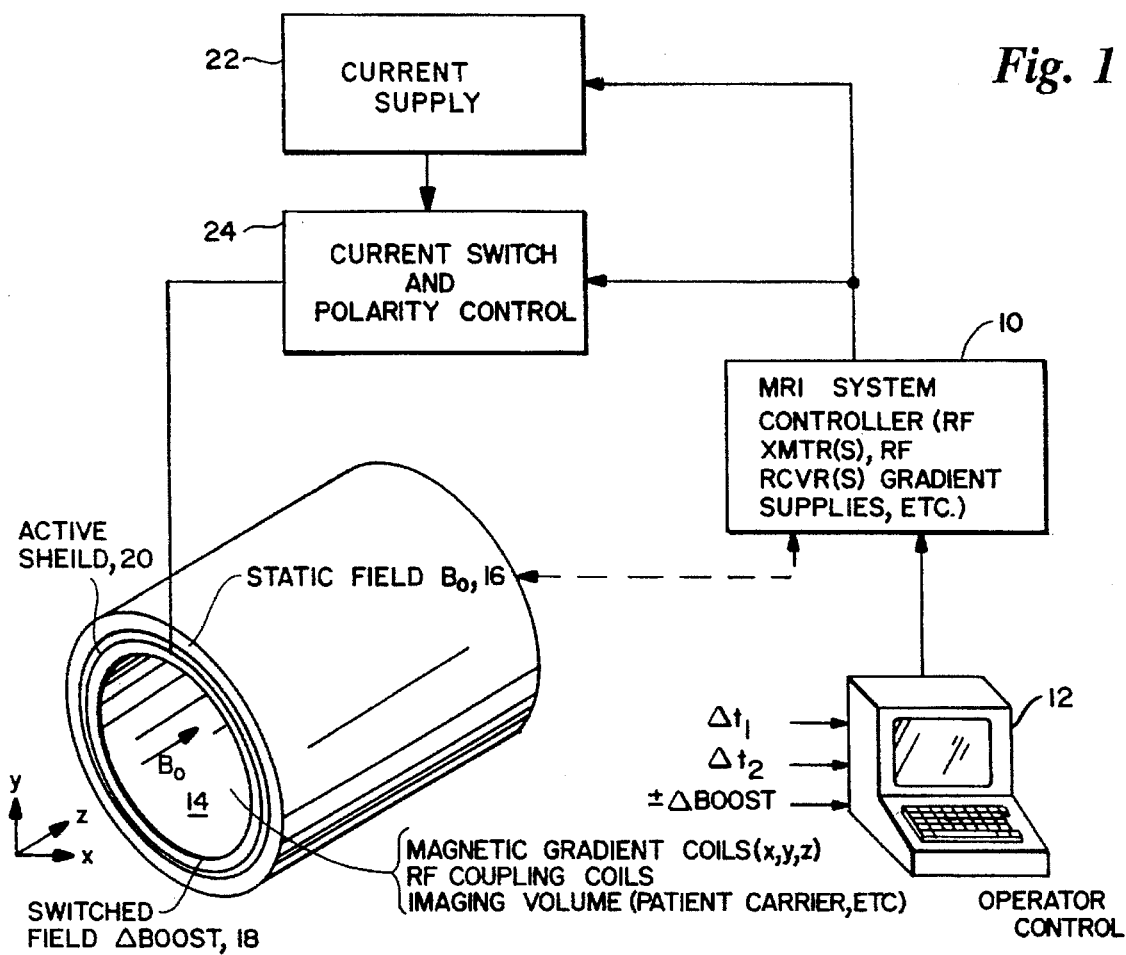
FIG. 1 is a schematic overall block diagram of an exemplary embodiment of an MRI system in accordance with this invention.

The NMR system controller 10 in FIG. 1 includes all of the usual and conventional RF transmitters, RF receivers, pulsed gradient field current supplies, etc., and interfaces with the usual operator control console 12 for controlling conventional MRI system components 14 such as magnetic gradient coils (typically in mutually orthogonal x,y,z axes orientation), one or more RF coupling coils, the imaging volume itself and associated patient carriers, etc). As will be appreciated by those in the art, at least the image volume is subjected to a static, substantially homogeneous, magnetic field $B_o$ generated by a suitable static field generator 16. Typical higher field static field generators are cryogenic solenoids (as happens to be depicted in FIG. 1). However, the invention is applicable to any static field generator design (e.g., including permanent magnet lower field structures where the $B_o$ static field is typically oriented in a vertical dimension as opposed to the horizontal orientation depicted with the solenoid static field generator 16 in FIG. 1).

In addition to the usual MRI system components, FIG. 1 also includes a switched field $\Delta$boost generator 18. Since the switched field generator 18 will produce rapidly changing magnetic flux in the vicinity of conductive surfaces associated with the static field generator 16, an active magnetic field shield structure 20 is preferably interposed therebetween so as to minimize eddy current losses—and time delays occasioned by opposing magnetic fields generated by such eddy currents. Such active shielding per se is believed to be known to those in the art and thus needs no further description here. Active shielding for pulsed magnetic gradient field coils is, for example, described in prior issued U.S. Pat. Nos. 4,733,189 and/or 4,737,716, the contents of both hereby being incorporated by reference.

The switched field generator 18 may be supplied with current pulses from a suitable current supply 22 via a current switch and polarity control 24, both being under control of the NMR system controller 10 as depicted in FIG. 1. By this means, the switched field generator 18 may be controlled so as to generate a magnetic field which either opposes or aids the static magnetic field $B_o$ (e.g., depending upon the polarity of current passed through an electromagnet coil). The polarity and magnitude of the $\Delta$boost switched field, its duration $\Delta t_1$ and its relative time position $\Delta t_2$ within a TR repetition interval may be controlled via the usual operator control keyboard of console 12 as also depicted in FIG. 1.

For those ordinarily skilled in this art, it is believed that modifications required for the typical MRI system controller 10 to implement this invention will be relatively straightforward. For example, a suitable supply of extra conventional input/output control ports and drivers should be provided. Remaining modifications typically may be effected by changing the program control structure of suitable program sub-modules so as to ensure the proper duration and timing of control signals at such ports (e.g., connected to the current supply 22 and to the switch and polarity control 24 and to the drive (not shown) for the active shield 20. It is believed that suitable control program modules will be readily apparent to those skilled in this art based upon schematic timing diagrams such as those associated with FIGS. 4-8 and 10. Thus, detailed flowcharts or source code listings, or the like, are totally unnecessary and superfluous for purposes of fully explaining and describing an enabling disclosure of this invention.

One possible charge capacitor current supply 22 and current switch and polarity control 24 are shown at FIG. 2A in somewhat more detail. Here, a suitable conventional dc power supply 40 is controlled by the MRI system control 10 to have a proper magnitude and is applied via control switch SW2 to charge capacitor bank C1. As will be appreciated, switch SW2 would be connected to capacitor C1 only during charging intervals (i.e., during times when the switched field coil 18 is "off").

When the switched field coil 18 is to be energized to the "on" condition, then the MRI system control 10 suitably controls switch SW2 to disconnect the power supply from capacitor bank C1 while controlling switch SW1 to select the desired polarity connection across capacitor banks C1 for an appropriate duration $\Delta t_1$—at the appropriate relative timing determined by $\Delta t_2$. In this manner, the switched field coil 18 may be controlled to a desired polarity, magnitude, duration and relative timing within each TR interval of an MRI sequence.

Ideally, for at least some applications, one would like to use a square wave of current I to drive the $\Delta$boost coil so as to achieve control of nuclei magnetization m as depicted in FIG. 2B. Here, the peak magnetization m coincides with cessation of the $\Delta$boost coil drive current I at time $t_o$. By thus arranging for the $\Delta$boost current to quickly go to zero, one can substantially immediately go into the next NMR pulse sequence—before the enhanced nuclei magnetization has a chance to decay significantly.

If a half-sinusoid drive current pulse I is used (as depicted in FIG. 2C and as would result from use of the FIG. 2A embodiment), then some decay of nuclei magnetization may have already occurred by time $t_o$.

Since the $\Delta$boost coil necessarily has inductance L, a presently preferred drive current power supply uses an approximately triangular shaped current pulse I as depicted in FIG. 2D. Here, one may possibly attain the best pulsed $\Delta$boost magnetization enhancement due to the very fast falling trailing edge of the drive current pulse I. This leaves the least time for enhanced magnetization m to decay before it can be advantageously utilized in the oncoming NMR pulse sequence.

Suitable "flyback" circuits for achieving the preferred results of FIG. 2D are depicted at FIGS. 2E and 2F. These flyback drive circuits apply a voltage source V across the $\Delta$boost coil L to ramp up the drive current I therethrough. Nuclei magnetization m follows suit as depicted. At the pulse end (as determined by trigger pulse source TS in conjunction with the base-emitter circuit of control transistor T1), the coil energy is dumped into capacitor C1 via diode D. To get the desired fast fall time, the voltage dumped across capacitor C1 should be about ten times or more greater than the voltage during ramp-up. This stored energy at $t_o$ in capacitor C1 is preferably drained back into voltage supply v for use on the next pulse cycle. The transistor switch T1 in both FIGS. 2E and 2F must, of course, be chosen to withstand the necessary high voltage there-across during capacitor charging.

As will be appreciated, other types of power supplies and switching arrangements could be utilized. The schematic depictions in FIGS. 2A-2F typically would be realized with solid state switch devices. In addition, a suitable synchronous drive for the active shield circuits 20 might also be derived by using the same control outputs of the MRI system control 10.

As depicted in FIG. 3, incremental increases in signal-to-noise provided by increased magnetization during a sample preparation period rapidly increase initially for increasing sample preparation periods. However, in accordance with the usual exponential approach to an asymptotic value, further incremental improvements in magnetization take increasingly longer times to achieve. At the same time, as indicated by the dotted schematic showing in FIG. 3, the available response signal sampling window time (for fixed TR) decreases (with attendant incremental decreases in effective overall signal-to-noise ratio).

Thus, for many reasons (a few of which are schematically depicted in FIG. 3), we have discovered that for limited maximum TR intervals, the most efficient use of available time involves a limited sample preparation period (during which a large proportion of the theoretically available increased nuclei magnetization will nevertheless still be attained) thereby leaving time for an increased sampling window (which further increases available signal-to-noise ratio).

A typical exemplary schematic timing diagram for one embodiment of this invention is depicted at FIG. 4. As therein depicted, an overall MRI sequence involves a great plurality of TR intervals (typically many hundreds). Each TR interval includes a sample preparation time and at least one NMR pulse sequence. Typically, a TR interval is thought of as involving an initial sample preparation period followed by an NMR pulse sequence. However, it may be possible to consider a TR interval as involving an NMR pulse sequence followed by a sample preparation period (i.e., in preparation for the next successive NMR pulse sequence in the next TR interval). Both types of TR definitions are depicted in FIG. 4 and will be used interchangeably herein.

The NMR pulse sequence itself may be of any desired or conventional type. For example, NMR spin echo image data may be generated by suitable known sequences of RF nutation pulses, pulsed magnetic gradient fields and the like. Gradient reversal spin echo and FID sequences are also well known. The NMR pulse sequence as schematically depicted in FIG. 4 also includes at least one sampling window time during which an elicited NMR RF response is received (and typically converted to a sequence of digitized values for subsequent digital processing). Thus, during the block of time labelled "NMR pulse sequence" in FIG. 4 all of these conventional NMR measurement activities take place in any desired sequence to generate a subset of MRI data for eventual use in constructing an image of NMR nuclei populations.

In the embodiment of FIG. 4, prior to each NMR pulse sequence, the switched field +$\Delta$boost is turned "on" for a duration $\Delta t_1$ during the sample preparation period, and remains on until a time $\Delta t_2$ prior to initiation of the NMR pulse sequence. As previously explained, the magnitude of the $\Delta$boost signal in the preferred embodiment is also controllable. In this exemplary embodiment, the polarity is chosen to aid the static magnetic field $B_o$. The duration of the switched field $\Delta t_1$ is substantially less than that required for equilibrium (i.e., much less than 3 T1 of the tissue being imaged) and is preferably between about 0.3 T1 and about 0.6 T1. One presently preferred exemplary embodiment utilizes a TR interval of about 1.25 T1 with about one-third of that TR interval being devoted to sample preparation time and the duration of switched field "on" time $\Delta t_1$ (the timing parameter $\Delta t_2$ being zero in this particular exemplary embodiment). Thus, $\Delta t_1$ is in this example approximately 0.4 T1. A range of approximately 0.4 T1 to about 0.5 T1 may for some circumstances be approximately optimum.

In general, the exemplary embodiment of FIG. 4 prepares nuclei magnetization between NMR pulse sequences with a stronger field than the usual $B_o$. If the sample preparation was continued for a very long time, then equilibrium and substantially maximum magnetization would be attained for the stronger field condition (e.g., as in Yamamoto et al). However, in this embodiment of our invention, the switched stronger field during sample preparation occurs for a relatively short time (e.g., very much shorter than that required to achieve equilibrium)—while yet long enough to achieve a substantial increase in net nuclei magnetization. Signal detection (e.g., during the NMR pulse sequence sampling window) is nevertheless conducted at a lower nominal magnetic field magnitude—thus permitting narrower RF reception bandwidths and higher signal-to-noise ratios (e.g., using relatively longer sampling windows).

During MRI RF signal detection, very high homogeneity is required of the static magnetic field (e.g., any gradient contained in the static magnetic field must be much less than the purposefully applied pulsed gradient fields incorporated within the NMR pulse sequence). Typically, this requires a relative static field homogeneity of about 100 parts per million or less. However, if the switched "static" field is merely used for predating magnetization, such extreme homogeneity is not required (e.g., relative homogeneity of perhaps even only 25% to 50% may be sufficient).

The actual dependence of nuclei magnetization on different switched "static" field strengths when utilizing switched fields in accordance with this invention is a complicated function of the two switched "static" field strengths and the relative amount of time the nuclei experience at each effective net field. The result of simulated data analysis is that, to acquire a complete set of MRI image data in a fixed amount of time, one may double the signal-to-noise ratio by tripling the effective or net magnetic field during a sample preparation time in the embodiment of FIG. 4.

Although perhaps the greatest motivation for utilizing a switched field MRI system is to prepare magnetization at a higher field level and then perform NMR pulse sequences at lower field levels as depicted in FIG. 4 and already explained, there are also several other possible advantageous applications for switched field MRI—once the basic switched field polarity and magnitude control capability is in place.

For example, as depicted in FIG. 5, it may be desirable for some purposes in a nominally high static magnetic field MRI system to lower the net "static" magnetic field during the NMR pulse sequence by using a switched field (of polarity to oppose the static $B_o$ field). Such lower magnetic field during the NMR pulse sequence will decrease the required RF transmitter power for RF nutation pulses employed in the sequence—and will also reduce the possibilities of patient injury otherwise present due to higher required RF transmitter power. (Of course since the switched field −$\Delta$boost is "on" during the NMR pulse sequence, it will now preferably be designed so as to provide a net magnetic field of sufficient homogeneity in accordance with usual MRI system design criteria).

Magnetic resonance spectroscopy imaging systems necessarily utilize rather high magnitude static magnetic field generators (e.g., so as to permit the imaging of NMR nuclei species other than hydrogen). In traditional MRSI systems, this necessitates relatively higher frequency RF nutation pulses. However, by using a negative polarity $\Delta$boost switched field during transmitted RF nutation pulses (e.g., as schematically depicted in FIG. 6), the required RF transmit frequency may be lowered (while yet permitting detection at the usual higher MRSI RF frequencies). In addition, required RF transmitter power is reduced (with reduction in potential patient injury as noted above)—while yet maintaining all of the required chemical shift information in the detected NMR RF responses (e.g., so as to retain suitable MRSI results).

Measurement of nuclei flows with respect to the imaging volume may also be enhanced with an embodiment as depicted in FIG. 7. Here, the relative magnetization of nuclei located outside the image volume may be enhanced. Thus, as flowing nuclei (e.g., flowing blood) enters the imaging volume, its NMR signal responses will be increased as compared to static nuclei. This will result in easier visualization of moving blood when viewing an MRI image. Measurements of blood flow may also be implemented in this manner. Relative magnetization may be increased by switching on an aiding +Δboost field outside the image volume during the sample preparation period and/or by switching "on" a negative polarity −Δboost field inside the image volume during the sample preparation period. In either case, the relative magnetization of nuclei located outside the image volume is increased (as compared to nuclei located inside the image volume).

Although truly static magnets (i.e., "on" all the time) have previously been used outside the imaging volume so as to increase magnetization of in-flowing nuclei, such prior art techniques required a relatively large distance between such secondary "static" magnet and the imaging volume. By using a switched magnet, it can be turned "off" during NMR data acquisition (thus not interfering with normal NMR data acquisition and thus permitting it to be located closer to the image volume).

As depicted in the embodiment of FIG. 8, certain sequences using switched fields can also be designed to suppress only image data from selected nuclei (thereby permitting one to image only specific desired tissues). For example, if the net magnetic field is reduced to approximately zero for roughly 300 milliseconds at the end of the sample preparation period (as depicted in FIG. 8), then the longitudinal magnetization of nuclei having T1 NMR parameters less than or close to this interval nearly vanishes. However, nuclei having T1 NMR parameters much longer than this interval will not be much affected. To eliminate short T1 tissues from the final image, the delay $\Delta t_2$ between the 300 ms field cancelling pulse and the NMR pulse sequence should be as short as possible. (Otherwise, these "fast" T1 tissues may regain their magnetization before the imaging sequence beings.) Accordingly, this exemplary embodiment could be used to selectively image cerebral spinal fluid (CSF) in the brain or spinal cord—while substantially suppressing NMR signal responses from surrounding tissues of less interest.

A typical permanent magnet MRI system is schematically depicted in FIG. 9 where permanent magnets 100 and 100' generate static magnetic field $B_o$ oriented in a vertical direction. In this particular exemplary embodiment, a "shaped" switched field is generated by an asymmetric coil arrangement and/or current flow through switched field generators. For example, a first switched field coil 102 may be supplied with current 2I during its "on" intervals so as to generate a +2Δboost aiding magnetic field thus enhancing magnetization and image signal-to-noise ratio in the patient's spinal area near that coil. In addition (or alternatively), an opposing or −Δboost magnetic field may be generated by coil 104 on the opposite side of the body so as to cause a relative decrease in magnetization for nuclei associated with other tissues (e.g., moving fat in the abdomen and/or other moving tissues associated with breathing artifact). As depicted in FIG. 9, the "suppression" coil 104 may be supplied with a lesser magnitude of current I so as to help shape the switched magnetic fields in the desired manner. However, even if supplied with equal currents (and even if only one of the coil structures 102, 104 is employed), the switched magnetic field is asymmetrical and therefore "shaped" within the image volume so as to selectively enhance imaging from some selected portions of the image volume (while simultaneously relatively suppressing images emanating from other portions of the image volume).

A schematic timing diagram for the shaped field embodiment of FIG. 9 is depicted at FIG. 10 and, in view of the above discussion, should be substantially self-explanatory.

As previously observed, contrast between tissues in NMR images may actually increase as the field strength decreases. Therefore, one may wish to prepare magnetization at a relatively lower field strength (to increase effective image contrast). Even though this would properly decrease image signal-to-noise ratio, for some imaging situations it may be desirable. In addition, as already noted, by controllably changing the magnitude, polarity, duration and timing of the switched magnetic fields, additional control variables are provided for achieving enhanced image contrast in some situations. For example, by trial and error one may change these added control parameters from one MRI sequence to the next and compare the resulting images to select the images having greatest contrast. However, once this trial and error procedure has been completed for a given imaging situation (e.g., for particular disease condition, for a particular organ or tissue type, etc.), then that particular combination of switched field imaging parameters could be recalled and controllably used again under similar imaging circumstances so as to provide optimum imaging results with minimum trial and error.

As those in the art will appreciate, some NMR sequences used in MRSI do not use magnetic gradient pulses. And in three-dimensioned MRI using back-projection filtered reconstruction techniques, MRI image data can be elicited with non-selective RF pulses and a virtually static magnitude magnetic gradient—that changes direction slightly between data acquisitions. Such direction changes could be effected during the "static" Δboost pulse when the gradient's action is basically irrelevant. And even if a magnetic gradient is pulsed "on" during the NMR data acquisition sequence, there only needs to be one pulse which changes direction for each subsequent acquisition.

In certain MRI sequences, it may also be possible to effectively use switched field Δboost other than during each TR interval. For example, there are now known some very fast partial flip angle gradient reversal spin echo imaging sequences (e.g., capable of acquiring all projections in about 0.4 second). Echo planar imaging is even faster than this. A relatively short Δboost pulse (e.g., less than enough to attain equilibrium—e.g., less than T1) just prior to either of these complete MRI sequences (e.g., see FIG. 11) could be useful (for the same reasons noted above when used within each TR interval).

Another example of such switched field pulse usage in conjunction with a complete fast MRI sequence is depicted in FIG. 12. Here, a 180° RF nutation pulse is applied prior to an echo planar MRI sequence (e.g., to eliminate fat tissues from the image by taking MRI data when the fat tissue magnetization passes through zero). By applying a Δboost pulse between the RF pre-conditioning pulse and the MRI sequence, one can cause the faster T1 tissue to have one polarity of magnetization while the longer T1 tissues remain in the opposite polarity of magnetization.

A stimulated echo MRI sequence would permit image phase encoding (e.g., pulses $\Delta B_y$ to occur even before the Δboost pulse within the NMR sequence itself (e.g., as schematically depicted in FIG. 13). The Δboost pulse may even occur during (e.g., see dotted lines in FIG. 13) or before the image phase encoding pulse so long as it occurs after the initial RF NMR nutation pulse (e.g., 90° as depicted in FIG. 13).

The switched field portion of the MRI sequence may occur in most embodiments during sample preparation. However, it may also be desirable to perform such Δboost sample preparation with other sample preparation techniques. As depicted in FIGS. 14A and 14B, RF sample preparation pulses may be employed during the switched field time interval. For example, inversion recovery sequences use an initial 180° RF nutation pulse which is also part of sample preparation. As depicted in FIG. 14A, the +Δboost pulse may be interspersed between 180° and 90° sample preparation pulses or, as depicted in FIG. 14B, it may overlap the 180° RF preparation pulse.

A bipolar Δboost application as depicted in FIG. 15 (where the area of the +Δboost pulse equals the area of the −Δboost pulse) may be especially interesting. For example, such bipolar pulses will have essentially no effect on relatively long T1 tissues. However, it will enhance imaging from short T1 tissues. Thus, bipolar pulses can be used to increase T1 image contrast.

It is, of course, also possible to use Δboost switched field pulses for less than all TR intervals in an entire MRI sequence and still derive some benefits and special effects.

While only a few exemplary embodiments of this invention have been described in detail, those skilled in the art will realize that many variations and modifications may be made in these exemplary embodiments while yet retaining many of the novel features and advantages of this invention. Accordingly, all such modifications and variations are intended to be included within the scope of the appended claims.

What is claimed is:

1. A magnetic resonance imaging method performed with a constant substantially homogeneous, static polarizing magnetic field $B_o$ generator and a plurality of pulsed gradient magnetic field $G_x$, $G_y$, $G_z$ generators applied to nuclei to be imaged, said method comprising the steps of:
   (a) applying a switched further polarizing magnetic field to said nuclei during a time interval $\Delta t_1$, which is less than the spin-lattice relaxation constant T1 NMR parameter of said nuclei,
   (b) performing an NMR pulse sequence including application of at least one RF NMR nutation pulse and a responsive RF NMR signal reception time window for acquiring MRI data; and
   wherein step (a) occurs during occurrence of step (b) and wherein said further polarizing magnetic field opposes said static magnetic field $B_o$.

2. A magnetic resonance imaging method as in claim 1 wherein step (b) includes an NMR spectroscopic imaging pulse sequence having at least one transmitted RF NMR pulse and wherein step (a) occurs only during transmission of said RF NMR pulse(s).

3. A magnetic resonance imaging method performed with a constant substantially homogeneous, static polarizing magnetic field $B_o$ generator and a plurality of pulsed gradient magnetic field $G_x$, $G_y$, $G_z$ generators applied to nuclei to be imaged, said method comprising the steps of:
   (a) applying a switched further polarizing magnetic field to said nuclei during a time interval $\Delta t_1$, which is less than the spin-lattice relaxation constant T1 NMR parameter of said nuclei,
   (b) performing an NMR pulse sequence including application of at least one RF NMR nutation pulse and a responsive RF NMR signal reception time window for acquiring MRI data; and
   wherein said further polarizing magnetic field is oriented in the same direction as said static magnetic field $B_o$ and is applied during step (a) to moving nuclei outside an MRI image volume prior to step (b) so as to enhance their magnetization upon subsequent entry into the image volume.

4. A magnetic resonance imaging method performed with a constant, substantially homogeneous, static polarizing magnetic field $B_o$ generator and a plurality of pulsed gradient magnetic field $G_x$, $G_y$, $G_z$ generators applied to nuclei to be imaged, said method comprising the steps of:
   (a) applying a switched further polarizing magnetic field to said nuclei which opposes said static magnetic field $B_o$;
   (b) during Step (a) performing an NMR pulse sequence including application of at least one RF NMR nutation pulse and a responsive RF NMR signal reception time for acquiring MRI data; and
   (c) repeating steps (a) and (b) during plural successive repetition intervals TR which include a period when said further polarizing magnetic field is not applied.

5. A magnetic resonance spectroscopic imaging method performed with a constant, substantially homogeneous, polarizing static magnetic field $B_o$ generator and a plurality of pulsed gradient magnetic field $G_x$, $G_y$, $G_z$ generators applied to nuclei to be imaged, said method comprising the steps of:
   (a) performing an NMR spectroscopic pulse sequence including application of at least one RF NMR nutation pulse and a responsive RF NMR signal reception time for acquiring MRSI data during each of plural successive repetition intervals TR; and
   (b) during application of said RF NMR nutation pulse(s) applying a switched further polarizing magnetic field to said nuclei which opposes said static magnetic field $B_o$ thereby reducing required RF transmission power and frequency.

6. A magnetic resonance imaging method performed with a constant, substantially homogeneous, static polarizing magnetic field $B_o$ generator and a plurality of pulsed gradient magnetic field $G_x$, $G_y$, $G_z$ generators applied to nuclei to be imaged within an image volume, said method comprising the steps of:
   (a) applying a switched further polarizing magnetic field to nuclei outside said image volume which is in the same sense as said static polarizing magnetic field $B_o$;
   (b) after step (a), performing an NMR pulse sequence including application of at least one RF NMR nutation pulse and a responsive RF NMR signal reception time for acquiring MRI data; and
   (c) repeating steps (a) and (b) during plural successive repetition intervals TR to acquire a set of related MRI data.

7. A magnetic resonance imaging method as in claim 6 further comprising, during step (a), also applying another switched polarizing magnetic field to nuclei inside said image volume in an opposite sense to said static polarizing magnetic field $B_o$.

8. A magnetic resonance imaging apparatus having a constant substantially homogeneous, static polarizing magnetic field $B_o$ generator and a plurality of pulsed gradient magnetic field $G_x$, $G_y$, $G_z$ generators applied to nuclei to be imaged, said apparatus comprising:
   (a) means for applying a switched further polarizing magnetic field to said nuclei during a time interval $\Delta t_1$, which is less than the spin-lattice relaxation constant T1 NMR parameter of said nuclei,
   (b) means for performing an NMR pulse sequence including application of at least one RF NMR nutation pulse and a responsive RF NMR signal reception time window for acquiring MRI data; and wherein said further polarizing magnetic field is oriented in the same direction as said static polarizing magnetic field $B_o$ and is applied to moving nuclei outside an MRI image volume to as to enhance their magnetization upon subsequent entry into the image volume.

9. A magnetic resonance imaging apparatus as in claim 8 wherein another polarizing magnetic field also is applied, inside the image volume and in opposition to said static polarizing magnetic field $B_o$.

10. A magnetic resonance imaging apparatus having a constant, substantially homogeneous, static polarizing magnetic field $B_o$ generator and a plurality of pulsed gradient magnetic field $G_x$, $G_y$, $G_z$ generators applied to nuclei to be imaged, said apparatus comprising:

(A) means for applying a switched further polarizing magnetic field to said nuclei which opposes said static polarizing magnetic field $B_o$;

(B) means for performing an NMR pulse sequence including application of at least one RF NMR nutation pulse and a responsive RF NMR signal reception time for acquiring MRI data; and (C) means for repetitively operating means (a) and (b) during plural successive repetition intervals TR which includes a sample preparation period when said further magnetic field is not applied.

11. A magnetic resonance spectroscopic imaging apparatus having a constant, substantially homogeneous, static polarizing magnetic field, $B_o$ generator and a plurality of pulsed gradient magnetic field $G_x$, $G_y$, $G_z$ generators applied to nuclei to be imaged, said apparatus comprising:

(a) means for performing an NMR spectroscopic pulse sequence including application of at least one RF NMR nutation pulse and a responsive RF NMR signal reception time for acquiring MRSI data during each of plural successive repetition intervals TR; and (b) means for, during application of said RF NMR nutation pulse(s), applying a switched further polarizing magnetic field to said nuclei which opposes said static polarizing magnetic field $B_o$ thereby reducing required RF transmission power and frequency.

12. A magnetic resonance imaging apparatus having a constant, substantially homogeneous, static polarizing magnetic field to $B_o$ generator and a plurality of pulsed gradient magnetic field $G_x$, $G_y$, $G_z$ generators applied to nuclei to be imaged within an image volume, said apparatus comprising:

(a) means for selectively applying a switched further polarizing magnetic field to nuclei outside said image volume which is in the same sense as said static polarizing magnetic field $B_o$;

(b) means for performing an NMR pulse sequence including application of at least one RF NMR nutation pulse and a responsive RF NMR signal reception time for acquiring MRI data; and (c) means for repetitively operating means (a) and (b) during plural successive repetition intervals TR to acquire a set of related MRI data.

13. A magnetic resonance imaging apparatus as in claim 12 further comprising, also applying another switched polarizing magnetic field to nuclei inside said image volume in an opposite sense to said static polarizing magnetic field $B_o$.

* * * * *